US010593520B2

(12) United States Patent
Wu et al.

(10) Patent No.: US 10,593,520 B2
(45) Date of Patent: Mar. 17, 2020

(54) TEMPERATURE ADJUSTING APPARATUS AND METHOD FOR A FOCUS RING

(71) Applicant: Advanced Micro-Fabrication Equipment Inc, Shanghai, Shanghai (CN)

(72) Inventors: Lei Wu, Shanghai (CN); Rubin Ye, Shanghai (CN); Bryan Pu, Shanghai (CN)

(73) Assignee: ADVANCED MICRO-FABRICATION EQUIPMENT INC. CHINA, Shanghai, Pudong (CN)

( * ) Notice: Subject to any disclaimer, the term of this patent is extended or adjusted under 35 U.S.C. 154(b) by 497 days.

(21) Appl. No.: 15/385,806

(22) Filed: Dec. 20, 2016

(65) Prior Publication Data

US 2017/0186590 A1 Jun. 29, 2017

(30) Foreign Application Priority Data

Dec. 24, 2015 (CN) .......................... 2015 1 0982830

(51) Int. Cl.
H01L 21/00 (2006.01)
H01J 37/32 (2006.01)
(Continued)

(52) U.S. Cl.
CPC .. H01J 37/32642 (2013.01); H01J 37/32082 (2013.01); H01J 37/32724 (2013.01);
(Continued)

(58) Field of Classification Search
USPC ....................................... 156/915
See application file for complete search history.

(56) References Cited

U.S. PATENT DOCUMENTS 6,676,804 B1 * 1/2004 Koshimizu ....... H01J 37/32623
118/724
8,858,753 B2 * 10/2014 Koshimizu ....... H01J 37/32091
118/723 E
(Continued)

FOREIGN PATENT DOCUMENTS

JP 2008288611 A * 11/2008

OTHER PUBLICATIONS

CN202651058U Peng et al.,Component for controlling outer edge temperature of focusing ring of base in plasma processing chamber, has heat-conducting pad placed between heat-conducting ring and base, where thickness of heat-conducting pad is in specific mm.,2013,Advanced Micro Fab Equipment, abstract. (Year: 2013).*
(Continued)

Primary Examiner — Sylvia MacArthur
Assistant Examiner — Michelle Crowell
(74) Attorney, Agent, or Firm — Womble Bond Dickinson (US) LLP; Joseph Bach, Esq.

(57) ABSTRACT

The present invention provides a temperature adjusting apparatus for a focus ring, wherein heat radiated from the plasma onto the focus ring is transferred downward to a base through the first heat conducting pad contacting a lower surface of the focus ring, an insulating ring contacting a lower surface of the first heat conducting pad, and the second heat conducting pad contacting a lower surface of the insulating ring, so as to be cooled by a cooling system provided at the base; turning on a heater disposed in a grounded shielding ring to generate a controllable external heating source, heat from the heater being transferred to the focus ring through the shielding ring, a third heat conducting pad contacting the shielding ring, the insulating ring contacting the third heat conducting pad, and the first heat conducting pad, so as to perform controllable warming to the
(Continued)

focus ring. By providing a good heat conduction path in conjunction with controllable heating power, the present invention achieves a fine control of the working temperature of the focus ring such that it is tunable in processing such as etching, thereby satisfying processing demands.

9 Claims, 2 Drawing Sheets

(51) Int. Cl.
    *H01L 21/67*     (2006.01)
    *H01L 21/687*     (2006.01)
(52) U.S. Cl.
    CPC .. *H01L 21/67103* (2013.01); *H01L 21/68735* (2013.01); *H01J 2237/334* (2013.01)

(56) References Cited

U.S. PATENT DOCUMENTS

| | | | | |
|---|---|---|---|---|
| 8,981,263 | B2* | 3/2015 | Sasaki | H01L 21/6831 118/725 |
| 2005/0274321 | A1* | 12/2005 | Ukei | C23C 16/4585 118/715 |
| 2008/0149598 | A1* | 6/2008 | Hayashi | H01J 7/32522 216/67 |
| 2010/0243620 | A1* | 9/2010 | Yamawaku | H01J 37/32623 219/121.54 |
| 2010/0307686 | A1* | 12/2010 | Iizuka | H01L 21/67103 156/345.34 |
| 2012/0175063 | A1* | 7/2012 | Yamawaku | H01J 37/32477 156/345.46 |
| 2012/0238040 | A1* | 9/2012 | Kubota | H01J 37/32091 438/5 |
| 2013/0288483 | A1* | 10/2013 | Sadjadi | H01L 21/02104 438/710 |
| 2016/0198528 | A1* | 7/2016 | Kitagawa | H05B 3/283 156/345.52 |
| 2017/0330734 | A1* | 11/2017 | Lee | H01J 37/3244 |

OTHER PUBLICATIONS

CN-202651058-U Peng et al., English translation. (Year: 2013).*

* cited by examiner

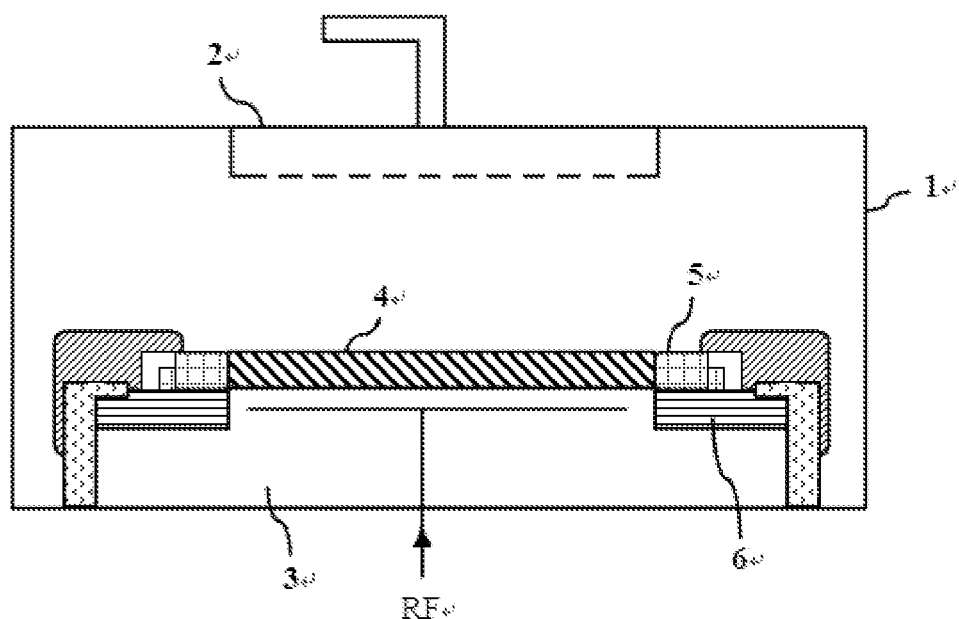
Fig 1 – Prior Art
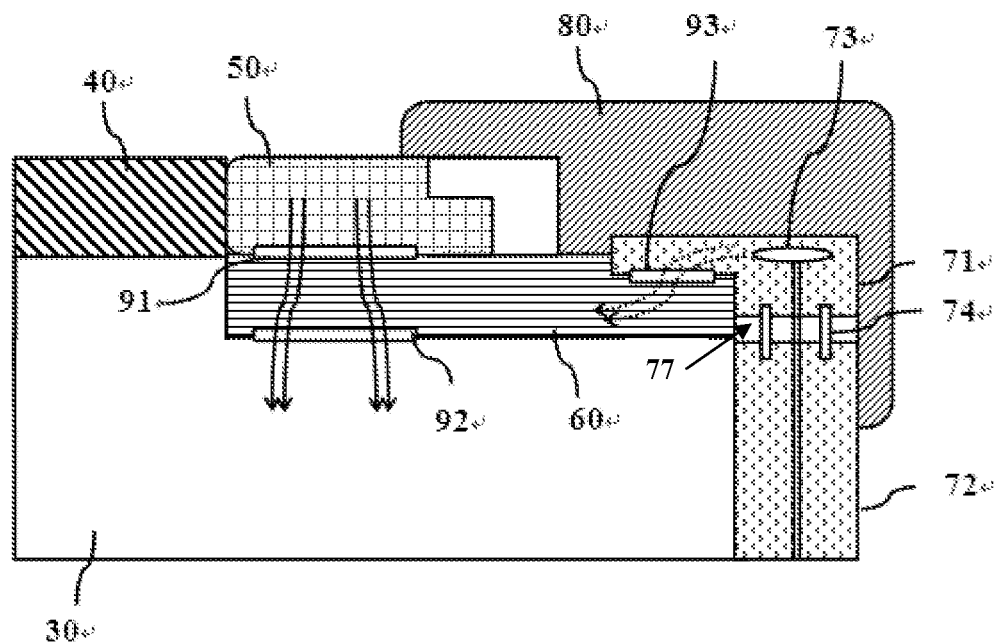
Fig 2

TEMPERATURE ADJUSTING APPARATUS AND METHOD FOR A FOCUS RING

RELATED APPLICATION

This application claims priority benefit from Chinese Patent Application No. 201510982830.3, filed on Dec. 24, 2015, the entire content of which is incorporated herein by reference.

FIELD OF INVENTION

The present invention relates to the field of manufacturing semiconductor devices, and more specifically relates to a temperature adjusting apparatus for a focus ring.

BACKGROUND OF INVENTION

A plasma processing apparatus ignites and sustains plasmas by introducing reaction gas containing appropriate etchant or deposition source gas into a vacuum reaction chamber and then inputting radio frequency energy into the vacuum reaction chamber to activate the reaction gas. In this way, through the plasma, a material layer on a substrate surface is etched or a material layer on the substrate surface is deposited, so as to process a semiconductor substrate.

As illustrated in FIG. 1, an existing capacitance-coupling plasma processing apparatus comprises a vacuum reaction chamber 1. Gas inlet means such as a gas shower head 2 provided at top within the reaction chamber 1 implements a function of an upper electrode, so as to couple the shower head to a ground or a radio frequency potential. A base 3 is provided at bottom within the reaction chamber 1. An electrostatic chuck provided on the base 3 and holds a substrate 4 during a process. A lower electrode is provided in the base 3. By applying radio frequency energy to the lower electrode, a radio frequency electric field is formed within the reaction chamber 1, and plasma is generated from the introduced reaction gas. A focus ring 5 is provided surrounding an outer edge of the base 4. By adjusting distribution of the entire radio frequency electric field within the reaction chamber 1, particularly by adjusting electric field distribution at an edge of the substrate 3, the focus ring 5 achieves the regulation of plasma uniformity.

Besides the electrical effect, temperature of the focus ring 5 will also affect deposition of polymers at the edge of the substrate 4, which causes the error of critical dimension. With the etching technique's demands on high aspect ratio process, high power (low frequency) etching processes are widely used which will lead to dramatic rise of the temperature within the reaction chamber 1, such that the substrate 4 and the focus ring 5 will get a lot of heat. In order to ensure etching uniformity of the substrate 4, a cooling medium pipeline of a cooling system that maintains the temperature of the base 3 is provided within the base 3, and the substrate 4 directly performs rapid heat removing through the electrostatic chuck and the base 3. Meanwhile, if the focus ring 5 lack of good heat transferring path, its temperature difference with the substrate 4 will rise. This will cause mistuning of the etching technique at the edge of the substrate 4.

An insulating ring 6 as a heat conducting layer is generally provided beneath the focus ring 5 to transfer heat of the focus ring 5 to the base 3. However, different processes require different working temperatures of the focus ring 5. The prior art only concerns how to enhance heat transfer performance of the focus ring 5 or how to maintain its temperature constant, no one could further controlling and adjusting the working temperature of the focus ring 5. In addition, the focus ring 5 is located within a radio frequency hot region, such that if a temperature adjusting device such as a heater is directly provided in the focus ring 5, not only wire layout becomes complex, but also a filter has to be provided to filter high frequency power; otherwise, a radio frequency interference will occur, which affects the processing effect of the entire apparatus.

DETAILED DESCRIPTION OF INVENTION

The present invention is to provide a temperature adjusting apparatus for a focus ring. By providing superb heat conduction path in conjunction with controllable heating power, fine control of the working temperature of the focus ring will be achieved, such that the working temperature is tunable in processing such as etching, thereby satisfying process demands.

For the purpose above, the present invention is to provide a temperature adjusting apparatus for a focus ring, the apparatus being provided in a plasma processing apparatus;

the plasma processing apparatus comprises a reaction chamber could be vacuumed, a plasma formed in the reaction chamber to process a substrate; a base for holding the substrate is disposed at a bottom within the reaction chamber; a focus ring is provided surrounding an outer edge of the substrate; an insulating ring is provided beneath the focus ring, the insulating ring being located on a step at the periphery of the base;

the temperature adjusting apparatus comprises a heater, the heater being provided in a grounded shielding ring; the shielding ring surrounds an outer edge of the step at the edge of the base and an outer edge of the insulating ring; a heat conducting pad is provided at a portion where the shielding ring and the insulating ring contact with each other, such that heat from the heater is transferred to the focus ring through the shielding ring, the heat conducting pad, and the insulating ring, so as to adjust the temperature of the focus ring.

Preferably, the heat conducting pad being provided at a portion where the shielding ring and the insulating ring contact with each other is referred to as a third heat conducting pad; then the temperature adjusting apparatus further comprises: a first heat conducting pad provided at a portion where the focus ring and the insulating ring contact with each other, heat from the heater being transferred to the focus ring through the shielding ring, the third heat conducting pad, the insulating ring, and the first heat conducting pad, so as to adjust the temperature of the focus ring.

Preferably, the temperature adjusting apparatus further comprises a second heat conducting pad provided at a portion where the insulating ring and the base contact with each other;

heat radiated from the plasma onto the focus ring is transferred to the base through the first heat conducting pad, the insulating ring, and the second heat conducting pad, and the heat being removed from the cooling system in the base.

Preferably, the first heat conducting pad, the second heat conducting pad, and the third heat conducting pad are made of an elastic silica-gel material.

Preferably, the shielding ring comprises an upper shielding part and a lower shielding part, and the heater is provided within the upper shielding part;

The upper shielding part and the lower shielding part are separated from each other to prevent heat provided by the heater from being transfer to the lower shielding part;

The upper shielding part and the lower shielding part are electrical connected via an electrode.

Preferably, the upper shielding part comprises a horizontal extension segment and a vertical extension segment, the horizontal extension segment being located on a step at the periphery of the insulating ring, and the vertical extension segment surrounding an outer edge of the insulating ring;

The lower shielding part surrounding the edge of the base.

Preferably, a gap divides the shielding ring into the upper shielding part and the lower shielding part, the top surface of lower shielding part and the bottom surface of the upper shielding part are anodized or the gap filled with an insulation component.

Preferably, the temperature adjusting apparatus comprises a temperature sensing probe to detect the temperature of the focus ring;

A filter that shields radio frequency is coupled to the temperature sensing probe that generates an electrical signal;

Or, the temperature sensing probe that generates an optical signal and transmits via an optical fiber to a non-radio frequency hot region for sampling.

Preferably, a covering ring is provided to the plasma processing apparatus, surrounding an outer edge of the focus ring, covering a portion of the insulating ring which is not shielded by the focus ring and covering the shielding ring.

The present invention also provides a temperature adjusting method for a focus ring, comprising:

Implementing a cooling procedure independently or cooperatively implementing cooling and controllable warming procedures to the focus ring in a plasma processing apparatus;

wherein heat radiated from the plasma onto the focus ring is transferred downward to a base contacting a second heat conducting pad through the first heat conducting pad contacting a lower surface of the focus ring, an insulating ring contacting a lower surface of the first heat conducting pad, and the second heat conducting pad contacting a lower surface of the insulating ring, so as to be cooled by a cooling system provided at the base;

turning on a heater disposed in a grounded shielding ring to generate a controllable external heating source, heat from heater being transferred to the focus ring through the shielding ring, a third heat conducting pad contacting the shielding ring, the insulating ring contacting the third heat conducting pad, and the first heat conducting pad, so as to perform controllable warming to the focus ring.

Compared with the prior art, the temperature adjusting apparatus for a focus ring according to the present invention has the following advantages: in the present invention, temperature control of the focus ring is implemented by independent implementation of a cooling mode or cooperative implementation of the cooling mode with a controllable heating mode. In the cooling mode, heat radiated from the plasma to the focus ring is directed onto a temperature-control aluminum base through two layers of silica gel heat conducting pads and a ceramic insulating ring sandwiched there between. In the controllable heating mode, a heater that generates a heater is disposed in the grounded shielding ring, the shielding ring being divided into an upper part and a lower par to insulate heat, the two parts being electrical connected by an electrode in to realize a grounded electricity conductive function, thereby avoiding radio frequency interference. In further conjunction with a good heat conducting performance of the silica gel heat conducting pad, large-amplitude adjustment of the temperature of the focus ring is realized, thereby improving the plasma processing technique.

BRIEF DESCRIPTION OF THE DRAWINGS

FIG. 1 illustrates a structural schematic diagram of an existing plasma processing apparatus;

FIG. 2 illustrates a structural schematic diagram of a temperature adjusting apparatus for a focus ring in the present invention;

DETAILED DESCRIPTION OF THE PREFERRED EMBODIMENTS

Figure 3:
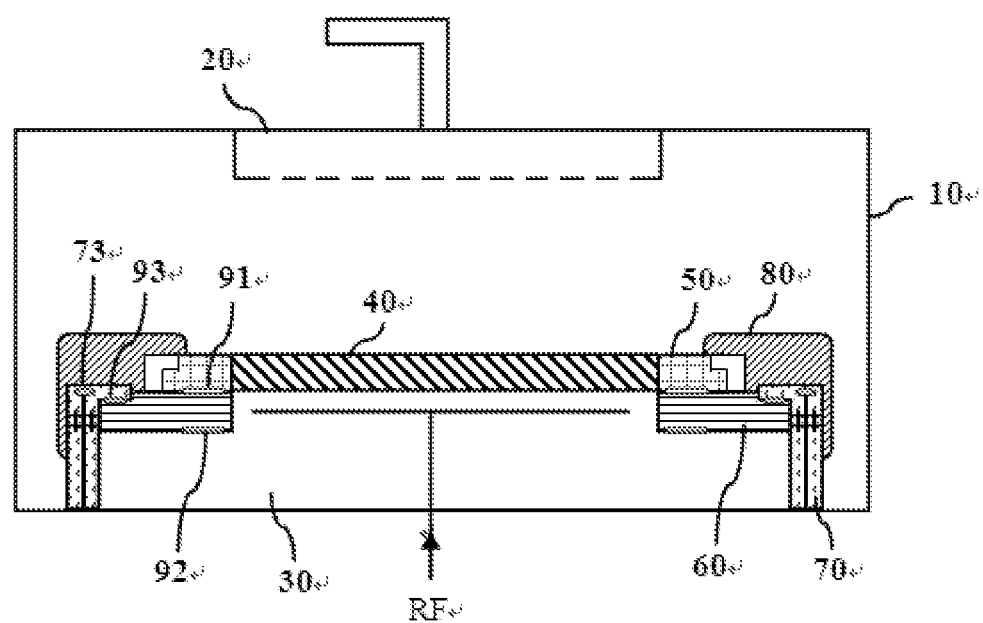
FIG. 3 illustrates a structural schematic diagram of a plasma processing apparatus in the present invention.

The present invention provides a temperature adjusting apparatus for a focus ring, adapted to a capacitance-coupling plasma processing apparatus. As shown in FIGS. 2 and 3, the plasma processing apparatus comprises a reaction chamber 10 having a substantially vacuum environment inside, a top within the reaction chamber 10 being provided with gas inlet means such as a gas shower head 20 connected to a reaction gas source, and the inlet means being provided with a grounded upper electrode. A base 30 holding a substrate 40 is disposed at a bottom within the reaction chamber 10. The base 30 may be made of aluminum. A cooling medium pipeline is provided inside the base 30 and connected to a cooling system; a lower electrode is provided at the base 30 where a radio frequency power is also applied; a radio frequency electric field is formed between the upper electrode and the lower electrode, so as to generate plasmas needed for a processing from the reaction gas directed into the reaction chamber 10.

A focus ring 50 is provided surrounding an outer edge of the to-be-processed substrate 40, for controlling uniformity of the plasmas. The temperature adjusting apparatus according to the present invention comprises an insulating ring 60 disposed beneath the focus ring 50. The insulating ring 60 is disposed on a step at the periphery of the base 30. The insulating ring 60 may be made of a ceramic material. Via the insulating ring 60, heat radiated from the plasmas onto the focus ring 50 is transferred downward to the base 30 without affecting electric field distribution within the reaction chamber 10.

A first heat conducting pad 91 is provided at a portion where the focus ring 50 and the insulating ring 60 contact with each other; a second heat conducting pad 92 is provided at a portion where the insulating ring 60 and the base 30 contact with each other. The first heat conducting pad 91 and the second heat conducting pad 92 may be made of an elastic silica gel material, such that they can be reliably attached to contact surfaces of components above and below. Heat of the focus ring 50 is transferred to the base 30 through the first heat conducting pad 91, the insulating ring 60, and the second heat conducting pad 92, such that the heat is removed by the cooling system disposed at the base 30.

Meanwhile, the temperature adjusting apparatus according to the present invention further comprises a heater 73 disposed in a grounded shielding ring 70. When the heater 73 is turned on, a heater is formed to adjust the temperature of the focus ring 50. A third heat conducting pad 93 is provided at a portion where the grounded shielding ring 70 and the insulating ring 60 contact with each other. The third heat conducting pad 93 may be made of an elastic silica gel material. Heat from the heater is transferred to the focus ring 50 through the shielding ring 70, the third heat conducting pad 93, the insulating ring 60, and the first heat conducting pad 91. The shielding ring 70 is disposed surrounding an outer edge of the insulating ring 60, for mainly defining the plasmas above the substrate 40 to prevent its diffusion. Because the heater 73 is cladded within the grounded shielding ring 70, radio frequency interference is effectively avoided.

The shielding ring 70 comprises an upper shielding part 71 and a lower shielding part 72; the heater 73 is disposed within the upper shielding part 71. In this example, a horizontal extending segment of the upper shielding part 71 is located on a step at the edge of the insulating ring 60; a vertical extending segment of the upper shielding part 71 surrounds an outer edge of the insulating ring 60; the lower shielding part 72 surrounds outside of the step at the edge of the base 30 beneath the insulating ring 60. Main bodies of the upper shielding part 71 and the lower shielding part 72 are isolated from each other to implement heat insulation; the upper shielding part 71 and the lower shielding part 72 are electrical connected by electrode 74 to realize the grounding and electricity conducting function of the shielding ring 70. The gap 77 of the shielding ring 70, the top surface of lower shielding part and the bottom surface of the upper shielding part are anodized or the gap filled with an insulation component so as to ensure that the heat from the heater will not be lost downwardly.

The plasma apparatus is provided with a covering ring 80 that surrounds an outer edge of the focus ring 50, covers a portion of the insulating ring 60 which is not shielded by the focus ring 50 and covers devices such as the shielding ring 70, so as to prevent erosion from active components of the plasmas to devices beneath the covering ring 80.

In order to accurately control a heating temperature of the focus ring 50, a temperature-sensing probe (not shown in the figure) may be set to probe a temperature of the focus ring 50. For the temperature-sensing probe that generates an electrical signal after probing, a filter needs to be provided for radio frequency shielding. Or, an optical signal-based temperature sensing probe may be used to emit optical signals of different spectrums or wavelength with respect to different temperatures as probed; the optical signals are directed via an optical fiber to a region without radio frequency for further sampling processing.

In the temperature adjusting method for a focus ring according to the present invention, heat radiated from the plasmas onto a focus ring 50 is transferred to a base 30 mainly through the first heat conducting pad 91, an insulating ring 60, and a second heat conducting pad 92 so as to be cooled; based on such a heat conduction cooling path, temperature of the focus ring 50 is lowered; suppose the cooled focus ring 50 is at a first temperature.

If the first temperature is lower than a second temperature prescribed for the focus ring 50 in a certain process, the prior art lacks means of further adjusting the temperature of the focus ring 50. However, in the present invention, by turning on a heater 73 in a shielding ring 70, a controllable external heating source is provided to the focus ring 50. Heat from the heater is transferred to the focus ring 50 through the shielding ring 70, the third heat conducting pad 93, the insulating ring 60, and the first heat conducting pad 91, so as to warm the focus ring 50. By adjusting power of the heater 73, heat provided by the heater to the focus ring 40 is controlled till the focus ring 50 reaches the required second temperature, so as to realize control and adjustment of the working temperature of the focus ring 50, thereby satisfying process needs.

Although the content of the present invention has been introduced in detail through the preferred embodiments above, it should be appreciated that the depiction above should not be regarded as a limitation to the present invention. After having read the content above, various modifications and substitutions to the present invention will be obvious to those skilled in the art. Therefore, the protection scope of the present invention should be limited by the appended claims.

The invention claimed is:

1. A temperature adjusting apparatus for a focus ring, the apparatus being provided in a plasma processing apparatus;

the plasma processing apparatus comprising:

a vacuum reaction chamber (10) wherein plasma is formed in the reaction chamber (10) to process a substrate (40); a base (30) for holding the substrate (40) is disposed at a bottom within the reaction chamber (10); a focus ring (50) is provided surrounding an outer edge of the substrate (40); an insulating ring (60) is provided beneath the focus ring (50), the insulating ring (60) is located on a step at the periphery of the base (60);

wherein, the temperature adjusting apparatus comprises a heater (73), the heater being cladded within a grounded shielding ring (70); the shielding ring (70) surrounds an outer edge of the step at the edge of the base (30) and an outer edge of the insulating ring (60); a heat conducting pad (93) is provided at a portion where the shielding ring (70) and the insulating ring (60) contact with each other, such that heat from the heater is transferred to the focus ring (50) through the shielding ring (70), the heat conducting pad (93), and the insulating ring (60), so as to adjust the temperature of the focus ring (50); and wherein the temperature adjusting apparatus further comprises: a first heat conducting pad (91) provided at a portion where the focus ring (50) and the insulating ring (60) contact with each other, heat from the heater being transferred to the focus ring (50) through the shielding ring (70), the heat conducting pad (93), the insulating ring (60), and the first heat conducting pad (91), so as to adjust the temperature of the focus ring (50).

2. The temperature adjusting apparatus according to claim 1, wherein, the temperature adjusting apparatus further comprises a second heat conducting pad (92) provided at a portion where the insulating ring (60) and the base (30) contact with each other;

the heat radiated from the plasma onto the focus ring (50) is transferred to the base (30) through the first heat conducting pad (91), the insulating ring (60), and the second heat conducting pad (92), and the heat being removed from a cooling system in the base (30).

3. The temperature adjusting apparatus according to claim 2, wherein, the first heat conducting pad (91), the second heat conducting pad (92), and the third heat conducting pad (93) are made of an elastic silica-gel material.

4. The temperature adjusting apparatus according to claim 2, wherein, the temperature adjusting apparatus comprises a temperature sensing probe to detect the temperature of the focus ring (50);

a filter that shields radio frequency is coupled to the temperature sensing probe that generates an electrical signal;

or, the temperature sensing probe that generates an optical signal and transmits via an optical fiber to a non-radio frequency hot region for sampling.

5. The temperature adjusting apparatus according to claim 1, wherein, the shielding ring (70) comprises an upper shielding part (71) and a lower shielding part (72), and the heater (73) is provided within the upper shielding part (71);

the upper shielding part (71) and the lower shielding part (72) are separated from each other to prevent heat provided by the heater (73) from being transfer to the lower shielding part (72);

the upper shielding part (71) and the lower shielding part (72) are electrical connected via an electrode (74).

6. The temperature adjusting apparatus according to claim 5, wherein, the upper shielding part (71) comprises a horizontal extension segment and a vertical extension segment, the horizontal extension segment being located on a step at the periphery of the insulating ring (60), and the vertical extension segment surrounding an outer edge of the insulating ring (60);

the lower shielding part (72) surrounding the edge of the base (30).

7. The temperature adjusting apparatus according to claim 5, wherein, a gap divides the shielding ring (70) into the upper shielding part (71) and the lower shielding part (72), the top surface of lower shielding part and the bottom surface of the upper shielding part are anodized or the gap filled with an insulation component.

8. The temperature adjusting apparatus according to claim 1, wherein, the temperature adjusting apparatus comprises a temperature sensing probe to detect the temperature of the focus ring (50);

a filter that shields radio frequency is coupled to the temperature sensing probe that generates an electrical signal;

or, the temperature sensing probe that generates an optical signal and transmits via an optical fiber to a non-radio frequency hot region for sampling.

9. The temperature adjusting apparatus according to claim 1, wherein, a covering ring (80) is provided to the plasma processing apparatus, surrounding an outer edge of the focus ring and covering a portion of the insulating ring which is not shielded by the focus ring and covering the shielding ring.

* * * * *